United States Patent
Kim et al.

(10) Patent No.: US 11,950,467 B2
(45) Date of Patent: Apr. 2, 2024

(54) DISPLAY DEVICE AND METHOD OF PROVIDING THE SAME

(71) Applicant: Samsung Display Co., LTD., Yongin-si (KR)

(72) Inventors: Byoungyong Kim, Seoul (KR); Sanghyeon Song, Suwon-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 267 days.

(21) Appl. No.: 17/680,526

(22) Filed: Feb. 25, 2022

(65) Prior Publication Data
US 2022/0392989 A1    Dec. 8, 2022

(30) Foreign Application Priority Data
Jun. 3, 2021  (KR) .......................... 10-2021-0072175

(51) Int. Cl.
*H10K 59/131* (2023.01)
*H01L 23/00* (2006.01)
(Continued)

(52) U.S. Cl.
CPC ........... *H10K 59/131* (2023.02); *H01L 24/05* (2013.01); *H01L 24/73* (2013.01); *H01L 24/81* (2013.01);
(Continued)

(58) Field of Classification Search
CPC .. H10K 59/131; H10K 71/00; H10K 59/1201; H10K 59/40; H10K 59/129; H10K 59/124; H01L 24/05; H01L 24/73; H01L 24/81; H01L 24/83; H01L 24/92; H01L 25/18; H01L 24/16; H01L 24/29; H01L 24/32; H01L 2224/05082; H01L 2224/05558; H01L 2224/05562; H01L 2224/05571; H01L 2224/05573;
(Continued)

(56) References Cited

U.S. PATENT DOCUMENTS 7,678,426 B2   3/2010  Flynn et al.
8,324,324 B2  12/2012  Yang et al.
(Continued)

FOREIGN PATENT DOCUMENTS

KR   10-1034181 B1   5/2011

*Primary Examiner* — Kyoung Lee
(74) *Attorney, Agent, or Firm* — CANTOR COLBURN LLP

(57) ABSTRACT

A display device includes a driving member which provides an electrical signal and includes a connection terminal which transmits the electrical signal, a pad electrode which receives the electrical signal from the driving member and is electrically connected to the connection terminal of the driving member, an organic layer on the pad electrode, the organic layer including a side surface defining an opening of the organic layer which exposes the pad electrode to outside the organic layer and within the opening, a protrusion protruding from the side surface, and a connection conductive layer which electrically connects the pad electrode to the connection terminal, within the opening of the organic layer, where the connection conductive layer covers each of the pad electrode which is exposed by the opening of the organic layer, the side surface of the organic layer, and the protrusion of the organic layer.

20 Claims, 8 Drawing Sheets

(51) Int. Cl.
  *H01L 25/18*      (2023.01)
  *H10K 71/00*      (2023.01)
  *H10K 59/12*      (2023.01)
(52) U.S. Cl.
  CPC .............. *H01L 24/83* (2013.01); *H01L 24/92* (2013.01); *H01L 25/18* (2013.01); *H10K 71/00* (2023.02); *H01L 24/16* (2013.01); *H01L 24/29* (2013.01); *H01L 24/32* (2013.01); *H01L 2224/05082* (2013.01); *H01L 2224/05558* (2013.01); *H01L 2224/05562* (2013.01); *H01L 2224/05571* (2013.01); *H01L 2224/05573* (2013.01); *H01L 2224/16014* (2013.01); *H01L 2224/16147* (2013.01); *H01L 2224/29021* (2013.01); *H01L 2224/29028* (2013.01); *H01L 2224/32145* (2013.01); *H01L 2224/73204* (2013.01); *H01L 2224/81898* (2013.01); *H01L 2224/83048* (2013.01); *H01L 2224/9211* (2013.01); *H10K 59/1201* (2023.02)

(58) Field of Classification Search
  CPC . H01L 2224/16014; H01L 2224/16147; H01L 2224/29021; H01L 2224/29028; H01L 2224/32145; H01L 2224/73204; H01L 2224/81898; H01L 2224/83048; H01L 2224/9211; H01L 25/167
  See application file for complete search history.

(56)            References Cited

U.S. PATENT DOCUMENTS 9,583,420  B2     2/2017   Lin et al.
  2011/0140117  A1*  6/2011   Lee ........................ H01L 27/12
                                                      438/34

* cited by examiner

DISPLAY DEVICE AND METHOD OF PROVIDING THE SAME

This application claims priority to Korean Patent Application No. 10-2021-0072175 filed on Jun. 3, 2021, and all the benefits accruing therefrom under 35 U.S.C. § 119, the entire disclosure of which is incorporated herein by reference.

BACKGROUND

1. Field

The present disclosure relates to a display device and a method of providing the same. More particularly, the present disclosure relates to a display device including a pad electrode, and a method of providing the display device.

2. Description of the Related Art

A display device may include a plurality of pixels, and may display an image by combining light emitted from the pixels. In order to drive the pixels, the display device may include a pad electrode and a driving chip which is electrically connected to the pad electrode.

SUMMARY

In general, a display device may be provided by forming a substrate including a plurality of pixels and a pad electrode connected thereto, and coupling a driving chip to the pad electrode. In this case, when a defect occurs in the coupling of the pad electrode and the driving chip, display quality of the display device may be degraded.

An embodiment of the present disclosure provides a display device with improved display quality.

An embodiment of the present disclosure provides a method of manufacturing (or providing) a display device with improved display quality.

However, embodiments of the present disclosure are not limited to the above-described features, and may be variously expanded without departing from the idea and scope of the present disclosure.

In an embodiment, a display device includes a substrate, a pad electrode layer on the substrate, an organic layer on the pad electrode layer and defining an opening which exposes at least a portion of a top surface of the pad electrode layer, and including a protruding part protruding from a side surface of the opening, a connection conductive layer covering the top surface of the pad electrode layer exposed by the opening, the side surface of the opening, and the protruding part, a connection terminal making contact with the connection conductive layer within the opening, and a driving chip on the connection terminal, and electrically connected to the connection terminal.

According to an embodiment, the connection terminal may make contact with a first portion of the connection conductive layer covering the protruding part while being spaced apart from a second portion of the connection conductive layer covering the top surface of the pad electrode layer.

According to an embodiment, the connection terminal may make contact with a first portion of the connection conductive layer covering the protruding part and a second portion of the connection conductive layer covering the top surface of the pad electrode layer.

According to an embodiment, the display device may further include an insulating adhesive member between the driving chip and the organic layer.

According to an embodiment, the pad electrode layer may include a first conductive layer on the substrate, and a second conductive layer on the first conductive layer, and making contact with the first conductive layer.

According to an embodiment, the pad electrode layer may further include a pad insulating layer between the first conductive layer and the second conductive layer and defining a through-hole which exposes at least a portion of a top surface of the first conductive layer, and the second conductive layer may make contact with the top surface of the first conductive layer exposed by the through-hole.

According to an embodiment, at least a portion of a top surface of the second conductive layer may be exposed by the opening, and the connection conductive layer may make contact with the top surface of the second conductive layer exposed by the opening.

In an embodiment, a display device includes a substrate, a pad electrode layer on the substrate, a first organic layer on the pad electrode layer and defining a first opening which exposes at least a portion of a top surface of the pad electrode layer, a second organic layer on the first organic layer and defining a second opening which exposes at least a portion of a top surface of the first organic layer adjacent to the first opening, and including a protruding part protruding from a side surface of the second opening, a connection conductive layer covering the top surface of the pad electrode layer exposed by the first opening, the top surface of the first organic layer exposed by the second opening, a side surface of the first opening, the side surface of the second opening, and the protruding part, a connection terminal making contact with the connection conductive layer within the second opening, and a driving chip on the connection terminal, and electrically connected to the connection terminal.

According to an embodiment, the connection terminal may make contact with a first portion of the connection conductive layer covering the protruding part while being spaced apart from a second portion of the connection conductive layer covering the top surface of the pad electrode layer.

According to an embodiment, the connection terminal may make contact with a first portion of the connection conductive layer covering the protruding part and a second portion of the connection conductive layer covering the top surface of the pad electrode layer.

According to an embodiment, the pad electrode layer may include a first conductive layer on the substrate, and a second conductive layer on the first conductive layer, and making contact with the first conductive layer.

According to an embodiment, the pad electrode layer may further include a pad insulating layer between the first conductive layer and the second conductive layer and defining a through-hole which exposes at least a portion of a top surface of the first conductive layer, and the second conductive layer may make contact with the top surface of the first conductive layer exposed by the through-hole.

According to an embodiment, at least a portion of a top surface of the second conductive layer may be exposed by the first opening, and the connection conductive layer may make contact with the top surface of the second conductive layer exposed by the first opening.

In an embodiment, a method of providing (or manufacturing) a display device includes providing (or forming) a pad electrode layer on a substrate, forming an organic layer on the pad electrode layer, forming an opening which exposes at least a portion of a top surface of the pad electrode layer and a protruding part protruding from a side surface of the opening by etching the organic layer, forming a connection conductive layer to cover the top surface of the pad electrode layer exposed by the opening, the side surface of the opening, and the protruding part, forming a driving circuit, which includes a connection terminal, and a driving chip on the connection terminal and electrically connected to the connection terminal, and allowing the connection terminal to make contact with the connection conductive layer by arranging the driving circuit.

According to an embodiment, the forming of the connection conductive layer may include applying a conductive material to a top surface of the organic layer, the top surface of the pad electrode layer exposed by the opening, the side surface of the opening, and the protruding part by a sputtering scheme, and removing the conductive material applied to the top surface of the organic layer.

According to an embodiment, the method may further include applying an insulating material onto the organic layer after the forming of the connection conductive layer.

According to an embodiment, the insulating material may be further applied between the connection conductive layer and the connection terminal.

According to an embodiment, the allowing of the connection terminal to make contact with the connection conductive layer may include softening the insulating material by applying heat, aligning the driving circuit such that the connection terminal and the opening overlap each other, and allowing the connection terminal to make contact with the connection conductive layer by pressing the driving circuit.

According to an embodiment, the connection terminal may make contact with a first portion of the connection conductive layer covering the protruding part while being spaced apart from a second portion of the connection conductive layer covering the top surface of the pad electrode layer.

According to an embodiment, the connection terminal may make contact with a first portion of the connection conductive layer covering the protruding part and a second portion of the connection conductive layer covering the top surface of the pad electrode layer.

According to the embodiments, the display device includes a substrate, a pad electrode layer on the substrate, an organic layer on the pad electrode layer and defining an opening which exposes at least a portion of a top surface of the pad electrode layer, and including a protruding part protruding from a side surface of the opening, a connection conductive layer covering the top surface of the pad electrode layer exposed by the opening, the side surface of the opening, and the protruding part, a connection terminal making contact with the connection conductive layer within the opening, and a driving chip on the connection terminal, and electrically connected to the connection terminal.

The protruding part may support the connection terminal. In addition, the connection conductive layer may make contact with the connection terminal within the opening. Accordingly, a defect may not occur in the coupling of the driving chip and the pad electrode layer, so that display quality of the display device can be improved.

However, effects of the present disclosure are not limited to the above-described effects, and may be variously expanded without departing from the idea and scope of the present disclosure.

BRIEF DESCRIPTION OF THE DRAWINGS

The above and other advantages and features of this disclosure will become more apparent by describing in further detail embodiments thereof with reference to the accompanying drawings, in which.

DETAILED DESCRIPTION

Figure 1:
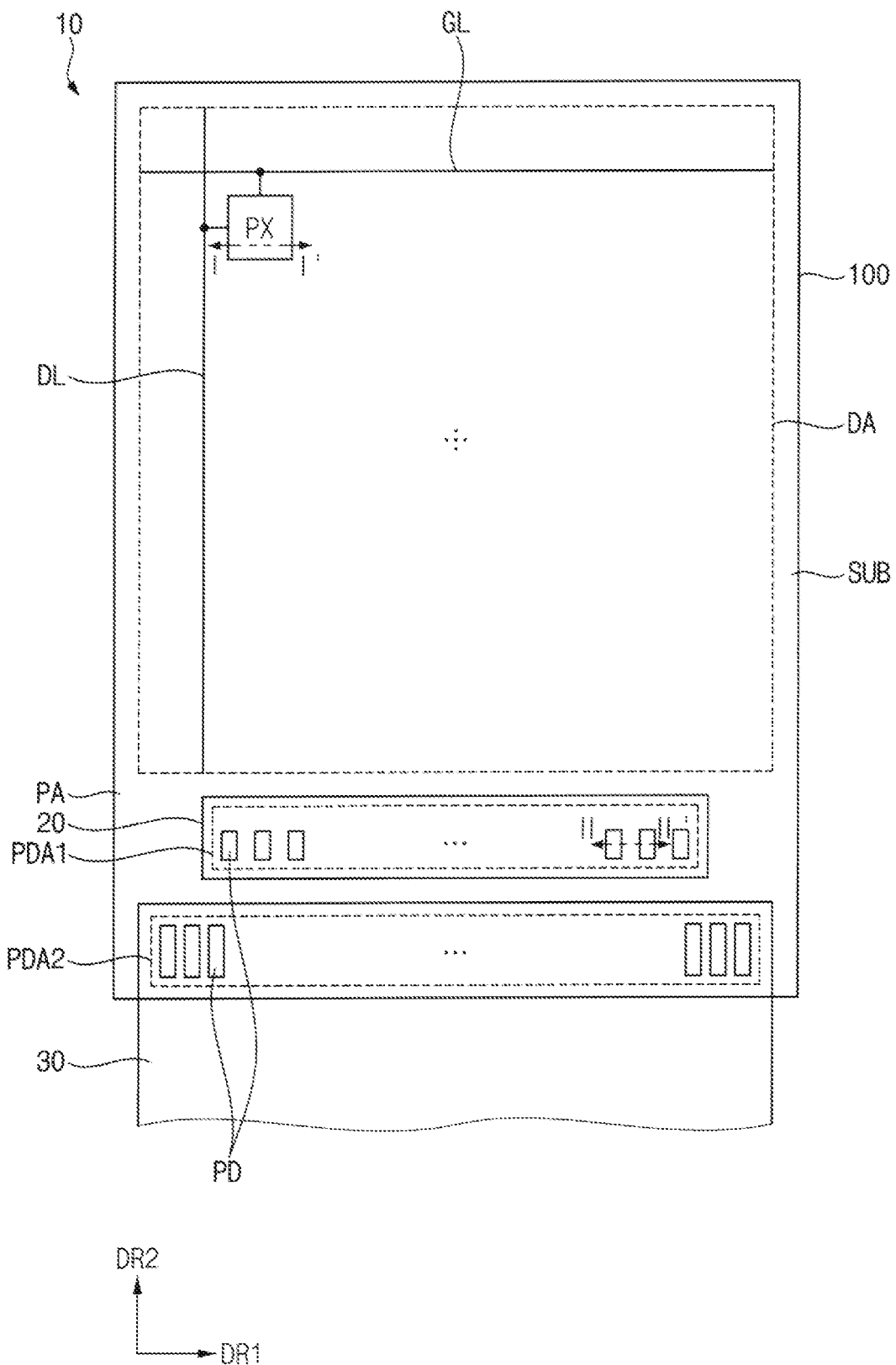
FIG. 1 is a plan view schematically showing an embodiment of a display device.

Hereinafter, embodiments will be described in more detail with reference to the accompanying drawings. The same or similar reference numerals will be used for the same elements in the accompanying drawings. As used herein, a reference number may indicate a singular element or a plurality of the element. For example, a reference number labeling a singular form of an element within the drawing figures may be used to reference a plurality of the singular element within the text of specification.

It will be understood that when an element is referred to as being related to another element such as being "on" another element, it can be directly on the other element or intervening elements may be present therebetween. In contrast, when an element is referred to as being related to another element such as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first" element, component, region, layer or section discussed below could be termed "a second" element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

FIG. 1 is a plan view schematically showing an embodiment of a display device 10.

Referring to FIG. 1, a display device 10 may include a display panel 100 including a display area DA and a peripheral area PA. The display area DA may be an area (e.g., planar area) in which an image is displayed, and the peripheral area PA may be an area in which components assisting in displaying the image in the display area DA are disposed. The peripheral area PA may be located at an edge of the display area DA such as being adjacent to the display area DA. The peripheral area PA may define a non-display area of the display panel 100, without being limited thereto. Various components or layers of the display device 10 may include a display area DA and a peripheral area PA corresponding to those described above for the display panel 100.

A pixel structure PX and signal lines (e.g., data and gate wires DL and GL) which are connected to the pixel structure PX and transmit electrical signals to the pixel structure PX may be disposed in the display area DA. The pixel structure PX may include a transistor and a light emitting diode. The gate wire GL may be connected to a gate driver (not shown), and may extend in (or along) a first direction DR1. The data wire DL may be connected to a data driver (not shown), and may extend in (or along) a second direction DR2 intersecting the first direction DR1. One or more of the above element may be provided in plural. A thickness direction of the display device 10 and various components or layers thereof, may be taken along a third direction which crosses each of the first direction DR1 and the second direction DR2.

The display area DA may display an image by combining light emitted from a plurality of pixel structures PX of the display panel 100. The pixel structures PX may be arranged in various shapes in the display area DA. In an embodiment, for example, the pixel structures PX may be arranged in a matrix form having a structure defined along both the first direction DR1 and the second direction DR2.

Wires, pad electrodes PD, and a driving part which transmits electrical signals to the display area DA may be located in the peripheral area PA. The peripheral area PA may include a first pad area PDA1 and a second pad area PDA2. The first pad area PDA1 and the second pad area PDA2 may be spaced apart from each other. In an embodiment, for example, the first pad area PDA1 may be located between the display area DA and the second pad area PDA2. The second pad area PDA2 may be closer to an end of the display panel 100 than the first pad area PDA1.

A plurality of pad electrodes PD may be disposed in each of the first and second pad areas PDA1 and PDA2. A driving member may be connected to the display panel 100 at the pad electrodes PD. As a driving member, for example, a driving chip 20 may be connected to the display panel 100 at the pad electrodes PD disposed in the first pad area PDA1, and a printed circuit board 30 may be connected to the display panel 100 at the pad electrodes PD disposed in the second pad area PDA2. The pad electrodes PD may receive an external signal as an electrical signal from the driving chip 20 and/or the printed circuit board 30. The pad electrodes PD may transmit the external signal from outside the display panel 100 to the pixel structure PX within the display panel 100.

The driving chip 20 may be electrically connected to the pad electrodes PD disposed in the first pad area PDA1. The driving chip 20 may control light emission of the pixel structure PX. The driving chip 20 may be an integrated circuit chip.

The printed circuit board 30 may be electrically connected to the pad electrodes PD disposed in the second pad area PDA2. The printed circuit board 30 may include a timing controller and a power supply voltage generator. The timing controller may generate a control signal as an electrical signal for driving the display device 10. The power supply voltage generator may generate a power supply voltage as an electrical signal.

The pad electrodes PD may be connected to a wire part. The wire part may include a wire connecting the pad electrode PD disposed in the first pad area PDA1 to the pad electrode PD disposed in the second pad area PDA2. The wire may receive a signal from the pad electrode PD disposed in the second pad area PDA2 and transmit the signal to the pad electrode PD disposed in the first pad area PDA1.

Figure 2:
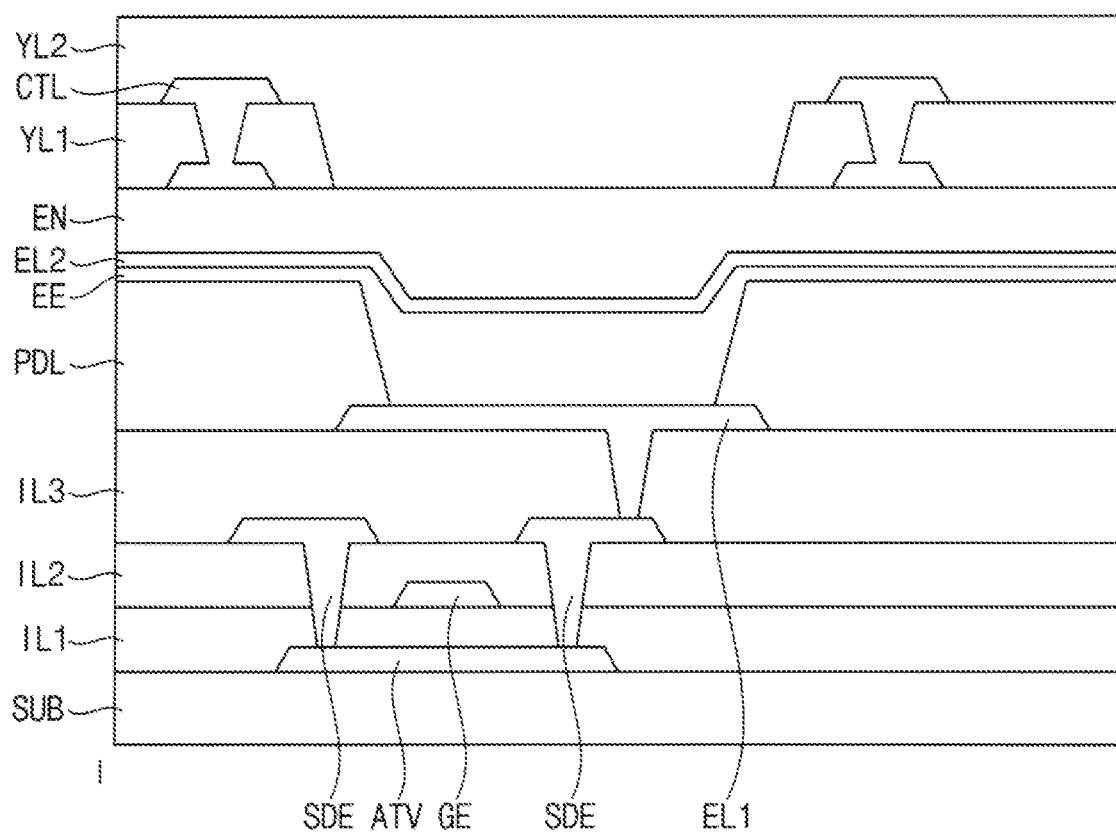
FIG. 2 is a cross-sectional view taken along line I-I' of FIG. 1.

FIG. 2 is a sectional view taken along line I-I' of FIG. 1.

Referring to FIG. 2, the display device 10 may include a substrate SUB, first to third insulating layers IL1, IL2, and IL3, a transistor, a light emitting diode, an encapsulation layer EN, a first touch insulating layer YL1, a second touch insulating layer YL2, and a touch electrode CTL. The transistor may include an active layer ATV, a gate electrode GE, and a source/drain electrode SDE. The light emitting diode may include a first electrode EL1, a second electrode EL2, and a light emitting layer EE.

The substrate SUB may include transparent glass. Alternatively, the substrate SUB may include plastic. According to an embodiment, the substrate SUB may have flexibility.

The active layer ATV may be disposed on the substrate SUB. The active layer ATV may include a semiconductor material. The active layer ATV may include a source region, a drain region, and a channel region.

The first insulating layer IL1 may be disposed on the substrate SUB. The first insulating layer IL1 may cover the active layer ATV. The first insulating layer IL1 may include an inorganic insulating material.

The gate electrode GE may be disposed on the first insulating layer IL1. The gate electrode GE may be electrically insulated from the active layer ATV by the first insulating layer IL1. The gate electrode GE may serve to adjust electrical conductivity of the active layer ATV. In an embodiment, for example, only when a voltage having a predetermined level or more is applied to the gate electrode GE, the active layer ATV may have electrical conductivity.

The second insulating layer IL2 may be disposed on the first insulating layer IL1. The second insulating layer IL2 may cover the gate electrode GE. The second insulating layer IL2 may include an inorganic insulating material.

The source/drain electrode SDE may be disposed on the second insulating layer IL2. The source/drain electrode SDE may make contact with at least a portion of the active layer ATV. As used herein, contact between elements may form an interface therebetween, without being limited thereto. In an embodiment, for example, the source/drain electrode SDE may make contact with at least a portion of the active layer ATV through (or at) a contact hole formed (or defined) through the first insulating layer IL1 and the second insulating layer IL2.

The third insulating layer IL3 may be disposed on the second insulating layer IL2. The third insulating layer IL3 may cover the source/drain electrode SDE. The third insulating layer IL3 may include an organic insulating material. The third insulating layer IL3 may have a substantially flat top surface.

The first electrode EL1 may be disposed on the third insulating layer IL3. The first electrode EL1 may be referred to as an anode electrode. The first electrode EL1 may make contact with the source/drain electrode SDE through a contact hole formed through the third insulating layer IL3.

A pixel defining layer PDL may be disposed on the third insulating layer IL3. The pixel defining layer PDL may define an opening that exposes at least a portion of a top surface of the first electrode EL1 to outside the pixel defining layer PDL. The pixel defining layer PDL may include an organic material.

The light emitting layer EE may be disposed on the pixel defining layer PDL and along the top surface of the first electrode EL1 exposed to outside the pixel defining layer PDL by (or at) the opening. The light emitting layer EE may emit light. The light emitting layer EE may include a hole injection layer, a hole transport layer, an organic emission layer, an electron transport layer, and/or an electron injection layer.

The second electrode EL2 may be disposed on the light emitting layer EE. The second electrode EL2 may be referred to as a cathode electrode.

The encapsulation layer EN may be disposed on the second electrode EL2. The encapsulation layer EN may include a first inorganic encapsulation layer, an organic encapsulation layer disposed on the first inorganic encapsulation layer, and a second inorganic encapsulation layer disposed on the organic encapsulation layer. The encapsulation layer EN may cover the second electrode EL2, the light emitting layer EE, and the first electrode EL1. The encapsulation layer EN may protect the second electrode EL2, the light emitting layer EE, and the first electrode EL1 from external moisture and gas.

The first and second touch insulating layers YL1 and YL2 may be disposed on the encapsulation layer EN. The first touch insulating layer YL1 may define an opening overlapping (or corresponding to) the first electrode EL1. The opening in the first touch insulating layer YL1 may correspond to the opening in the pixel defining layer PDL. The second touch insulating layer YL2 may be disposed on the first touch insulating layer YL1, and may fill the opening defined in the first touch insulating layer YL1. A refractive index of the second touch insulating layer YL2 may be greater than a refractive index of the first touch insulating layer YL1. In an embodiment, for example, the second touch insulating layer YL2 may include an organic material having a high refractive index.

The touch electrode CTL may be disposed on the encapsulation layer EN. The touch electrode CTL may sense an input from outside the display panel 100. The input may be a touch such as from a body part, pen, etc. In an embodiment, for example, the touch electrode CTL may include a first sub-conductive layer and a second sub-conductive layer which is disposed on the first sub-conductive layer, where the second sub-conductive layer may be connected to the first sub-conductive layer through a contact hole formed through the first touch insulating layer YL1.

Figure 3:
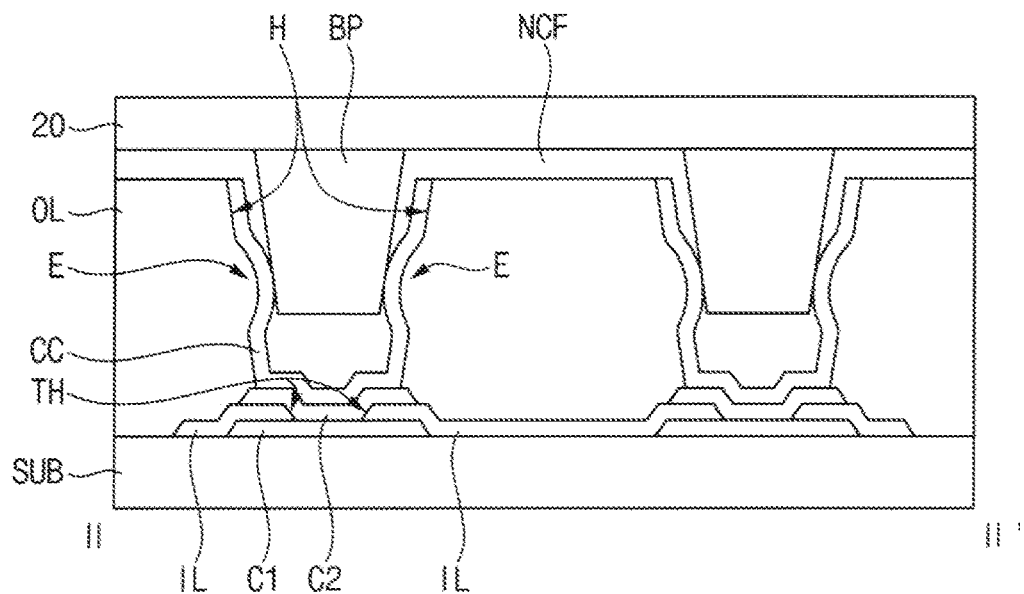
FIGS. 3 to 6 are cross-sectional views taken along line II-II' of FIG. 1.
Figure 4:
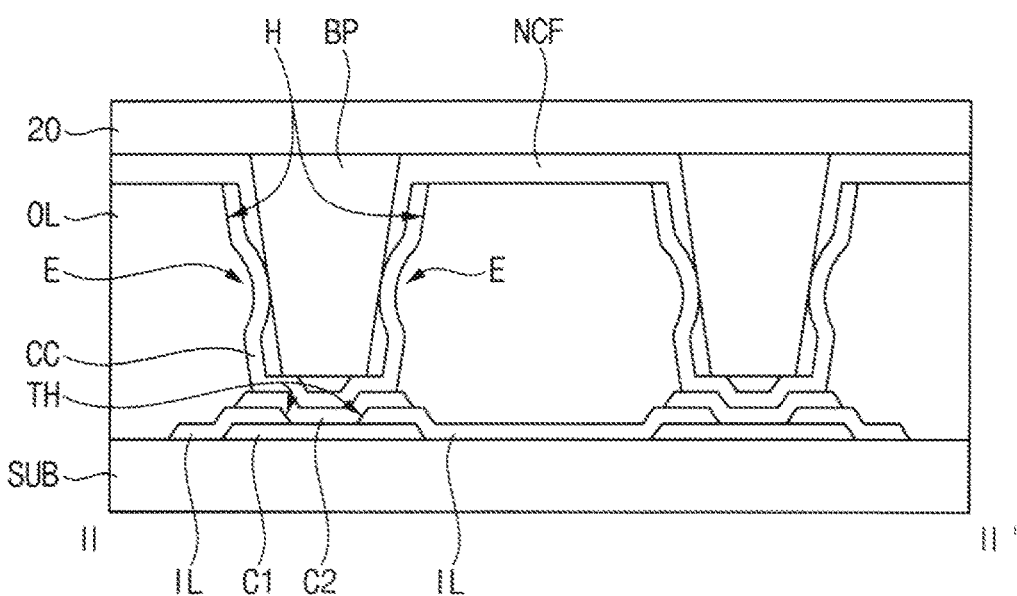

FIGS. 3 and 4 are sectional views of embodiments of a pad electrode PD included in the display device 10 of FIG. 1. FIGS. 3 and 4 are sectional views taken along line II-II' of FIG. 1.

Referring to FIGS. 1 and 3, the display device 10 may include a substrate SUB, a pad electrode PD, an organic layer OL, a connection conductive layer CC, a connection terminal BP, and a driving chip 20. The pad electrode PD may include a pad electrode layer. In an embodiment, for example, the pad electrode layer may include a first conductive layer C1, a second conductive layer C2, and a pad insulating layer IL.

The substrate SUB may include transparent glass. Alternatively, the substrate SUB may include plastic. According to an embodiment, the substrate SUB may have flexibility.

The first conductive layer C1 may be disposed on the substrate SUB. The first conductive layer C1 may include a conductive material. According to an embodiment, the first conductive layer C1 may include the same material as the gate electrode GE described with reference to FIG. 2. As used herein, elements which include a same material as each other, may be respective patterns of a same material layer which is on the substrate SUB, without being limited thereto.

The second conductive layer C2 may be disposed on the first conductive layer C1. The second conductive layer C2 may include a conductive material. According to an embodiment, the second conductive layer C2 may include the same material as the source/drain electrode SDE described with reference to FIG. 2. The second conductive layer C2 may make contact with the first conductive layer C1.

The pad insulating layer IL may be disposed between the first conductive layer C1 and the second conductive layer C2. The pad insulating layer IL may define a through-hole TH (e.g., a contact hole) that exposes at least a portion of a top surface of the first conductive layer C1 to outside the pad insulating layer IL. In this case, the second conductive layer C2 may make contact with the top surface of the first conductive layer C1 exposed by the through-hole TH. The pad insulating layer IL may include an inorganic insulating material. According to an embodiment, the pad insulating layer IL may include the same material as the first insulating layer IL1 or the second insulating layer IL2 described with reference to FIG. 2.

The organic layer OL may be disposed on the pad electrode layer of the pad electrode PD. The organic layer OL may include an organic insulating material. The organic layer OL may define an organic layer opening H that exposes at least a portion of a top surface of the pad electrode layer to outside the organic layer OL. In an embodiment, for example, the organic layer opening H may expose at least a portion of a top surface of the second conductive layer C2 to outside the organic layer OL.

A side surface of the organic layer OL defines the organic layer opening H. The organic layer OL may include a protruding part E (e.g., protrusion) which protrudes further than a remainder of the side surface, in a direction along the substrate SUB (e.g., toward the organic layer opening H). The protruding part E may serve to support the connection terminal BP that will be described below. The organic layer opening H may have a width in a direction along the substrate SUB. The width of the organic layer opening H may be minimum at the protruding part E, without being limited thereto.

A height (or thickness) of the organic layer OL may be defined along a thickness direction of the display panel 100. A height of the organic layer OL may be about 5 micrometers ($\mu m$) or more and about 10 $\mu m$ or less. In an embodiment, the height of the organic layer OL may be about 6 $\mu m$ or more and about 9 $\mu m$ or less.

The connection conductive layer CC may include a conductive material. The connection conductive layer CC may cover the top surface of the pad electrode layer exposed by the organic layer opening H. In an embodiment, for example, the connection conductive layer CC may cover the top surface of the second conductive layer C2 exposed by the organic layer opening H. In addition, the connection conductive layer CC may cover the side surface of the organic layer OL at the organic layer opening H and the protruding part E. According to an embodiment, the connection conductive layer CC may include the same material as the touch electrode CTL described with reference to FIG. 2.

The connection terminal BP may include a conductive material. The connection terminal BP may make contact with the connection conductive layer CC. In detail, the connection terminal BP may make contact with the connection conductive layer CC within the organic layer opening H.

According to an embodiment, the connection terminal BP may make contact with a first portion of the connection conductive layer CC covering the protruding part E. Simultaneously, the connection terminal BP may be spaced apart from a second portion of the connection conductive layer CC covering the top surface of the pad electrode layer. In an embodiment, for example, the second portion of the connection conductive layer CC may be a portion of the connection conductive layer CC covering the top surface of the second conductive layer C2. That is, the connection terminal BP includes a distal end closest to the pad electrode PD which is exposed by the organic layer opening H. Within the organic layer opening H, the connection conductive layer CC includes a first portion at the protrusion (e.g., the protruding part E) of the organic layer OL which contacts the connection terminal BP, and a second portion at the pad electrode PD which is exposed by the organic layer opening H and is spaced apart from the distal end of the connection terminal BP.

The driving chip 20 may be disposed on the connection terminal BP. The driving chip 20 may be electrically connected to the connection terminal BP. Accordingly, the driving chip 20 may generate an electrical signal which is transmitted to the first conductive layer C1 and the second conductive layer C2 through the connection terminal BP and the connection conductive layer CC.

According to an embodiment, an insulating adhesive member NCF may be disposed between the driving chip 20 and the organic layer OL. The insulating adhesive member NCF may include an insulating material. In addition, the insulating adhesive member NCF may be disposed between the connection terminal BP and the connection conductive layer CC. The insulating adhesive member NCF may provide adhesive strength so that the driving chip 20 and the connection terminal BP may be coupled to the organic layer OL and the connection conductive layer CC.

Referring to FIGS. 1 and 4, the display device 10 may include a substrate SUB, a pad electrode PD, an organic layer OL, a connection conductive layer CC, a connection terminal BP, and a driving chip 20. The pad electrode PD may include a pad electrode layer. In an embodiment, for example, the pad electrode layer may include a first conductive layer C1, a second conductive layer C2, and a pad insulating layer IL.

Components included in the display device 10 shown in FIG. 4 may be substantially the same as the components included in the display device 10 shown in FIG. 3 except for the connection terminal BP. Therefore, descriptions of the components that are substantially the same as the components included in the display device 10 shown in FIG. 3 may be omitted below.

Referring to FIGS. 1 and 4, the connection terminal BP may include a conductive material, and the connection terminal BP may make contact with the connection conductive layer CC within the organic layer opening H.

According to an embodiment, the connection terminal BP may make contact with a first portion of the connection conductive layer CC which covers the protruding part E (e.g., at the protruding part E). Simultaneously, the connection terminal BP may make contact with a second portion of the connection conductive layer CC which covers the top surface of the pad electrode layer. In an embodiment, for example, the second portion of the connection conductive layer CC may be a portion of the connection conductive layer CC covering the top surface of the second conductive layer C2. That is, within the organic layer opening H, the connection conductive layer CC includes a first portion at the protrusion (e.g., the protruding part E) of the organic layer OL which contacts the connection terminal BP, and a second portion at the pad electrode PD which contacts the distal end of the connection terminal BP.

Figure 5:
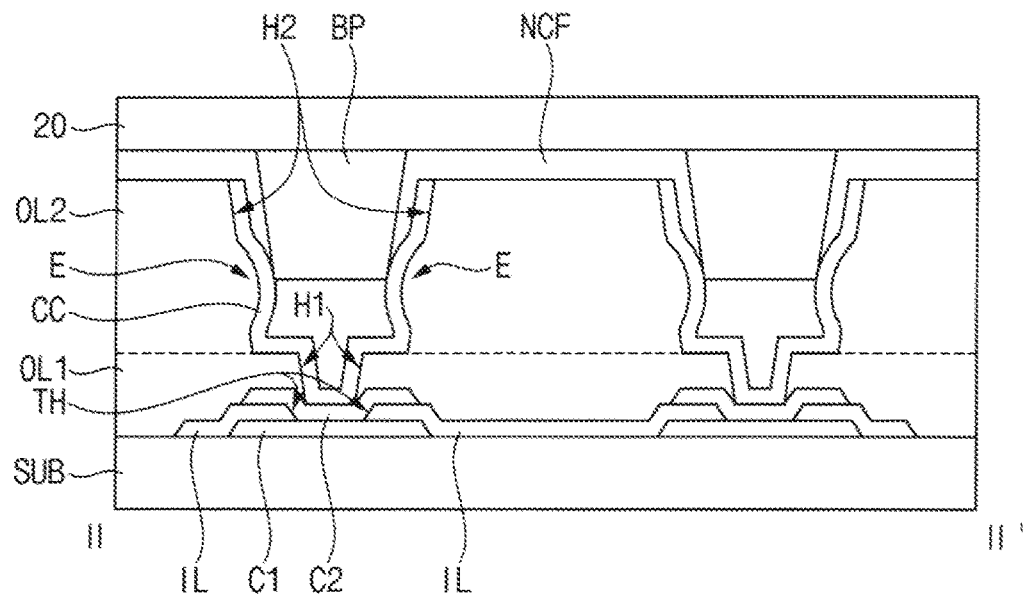
Figure 6:
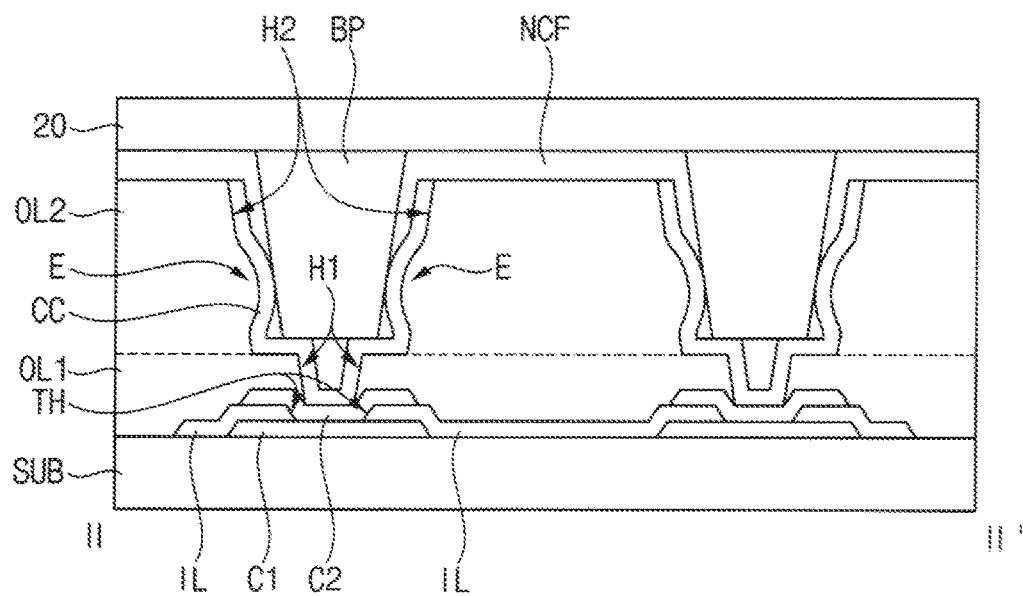

FIGS. 5 and 6 are sectional views of embodiments of a pad electrode PD included in the display device 10 of FIG. 1. FIGS. 5 and 6 are sectional views taken along line II-II' of FIG. 1.

Referring to FIGS. 1 and 5, the display device 10 may include a substrate SUB, a pad electrode PD, a first organic layer OL1, a second organic layer OL2, a connection conductive layer CC, a connection terminal BP, and a driving chip 20. The pad electrode PD may include a pad electrode layer. In an embodiment, for example, the pad electrode layer may include a first conductive layer C1, a second conductive layer C2, and a pad insulating layer IL.

The substrate SUB may include transparent glass. Alternatively, the substrate SUB may include plastic. According to an embodiment, the substrate SUB may have flexibility.

The first conductive layer C1 may be disposed on the substrate SUB. The first conductive layer C1 may include a conductive material. According to an embodiment, the first conductive layer C1 may include the same material as the gate electrode GE described with reference to FIG. 2.

The second conductive layer C2 may be disposed on the first conductive layer C1. The second conductive layer C2 may include a conductive material. According to an embodiment, the second conductive layer C2 may include the same material as the source/drain electrode SDE described with reference to FIG. 2. The second conductive layer C2 may make contact with the first conductive layer C1.

The pad insulating layer IL may be disposed between the first conductive layer C1 and the second conductive layer C2. The pad insulating layer IL may define a through-hole TH that exposes at least a portion of a top surface of the first conductive layer C1. In this case, the second conductive layer C2 may make contact with the top surface of the first conductive layer C1 exposed by the through-hole TH. The pad insulating layer IL may include an inorganic insulating material. According to an embodiment, the pad insulating layer IL may include the same material as the first insulating layer IL1 or the second insulating layer IL2 described with reference to FIG. 2.

The first organic layer OL1 may be disposed on the pad electrode layer. The first organic layer OL1 may include an organic insulating material. The first organic layer OL1 may define a first organic layer opening H1 that exposes at least a portion of a top surface of the pad electrode layer to outside the first organic layer OL1. In an embodiment, for example, the first organic layer opening H1 may expose at least a portion of a top surface of the second conductive layer C2 to outside the first organic layer OL1.

The second organic layer OL2 may be disposed on the first organic layer OL1. The second organic layer OL2 may include an organic insulating material. The second organic layer OL2 may define a second organic layer opening H2 that exposes at least a portion of a top surface of the first organic layer OL1 that is adjacent to the first organic layer opening H1 to outside the second organic layer OL2. The top surface may extend along the substrate SUB.

The second organic layer OL2 may include a protruding part E protruding from a remainder of the side surface of the second organic layer OL2 at the second organic layer opening H2. The protruding part E may serve to support the connection terminal BP that will be described below.

A height of the first organic layer OL1 may be about 2.5 μm or more and about 5 μm or less. In addition, a height of the second organic layer OL2 may be about 2.5 μm or more and about 5 μm or less. In an embodiment, the height of the first organic layer OL1 may be about 3 μm or more and about 4 μm or less, and the height of the second organic layer OL2 may be about 3 μm or more and about 4 μm or less.

According to an embodiment, the first organic layer OL1 and the second organic layer OL2 may be formed integrally with each other. That is, an organic layer OL may include a first thickness portion (e.g., the first organic layer OL1) and a second thickness portion (e.g., the second organic layer OL2) in order in a direction away from the substrate SUB. That is, within the organic layer OL, the second thickness portion may be further from the substrate SUB than the first thickness portion.

The connection conductive layer CC may include a conductive material. The connection conductive layer CC may cover the top surface of the pad electrode layer exposed by the first organic layer opening H1. In an embodiment, for example, the connection conductive layer CC may cover the top surface of the second conductive layer C2 exposed by the first organic layer opening H1. In addition, the connection conductive layer CC may cover the top surface of the first organic layer OL1 exposed by the second organic layer opening H2, the side surface of the first organic layer OL1 which defines the first organic layer opening H1, the side surface of the second organic layer OL2 which defines the second organic layer opening H2, and the protruding part E. According to an embodiment, the connection conductive layer CC may include the same material as the touch electrode CTL described with reference to FIG. 2.

The connection terminal BP may include a conductive material. The connection terminal BP may make contact with the connection conductive layer CC at one or more locations along a respective organic layer opening. In detail, the connection terminal BP may make contact with the connection conductive layer CC within the second organic layer opening H2.

According to an embodiment, the connection terminal BP may make contact with a first portion of the connection conductive layer CC covering the protruding part E. Simultaneously, the connection terminal BP may be spaced apart from a second portion of the connection conductive layer CC covering the top surface of the pad electrode layer. In an embodiment, for example, the second portion of the connection conductive layer CC may be a portion of the connection conductive layer CC covering the top surface of the second conductive layer C2.

The driving chip 20 may be disposed on the connection terminal BP. The driving chip 20 may be electrically connected to the connection terminal BP. Accordingly, the driving chip 20 may generate an electrical signal which is transmitted to the first conductive layer C1 and the second conductive layer C2 through the connection terminal BP and the connection conductive layer CC.

According to an embodiment, an insulating adhesive member NCF may be disposed between the driving chip 20 and the first and second organic layers OL1 and OL2. The insulating adhesive member NCF may include an insulating material. In addition, the insulating adhesive member NCF may be disposed between the connection terminal BP and the connection conductive layer CC. The insulating adhesive member NCF may provide adhesive strength so that the driving chip 20 and the connection terminal BP may be coupled to the first and second organic layers OL1 and OL2 and the connection conductive layer CC.

Referring to FIGS. 1 and 6, the display device 10 may include a substrate SUB, a pad electrode PD, a first organic layer OL1, a second organic layer OL2, a connection conductive layer CC, a connection terminal BP, and a driving chip 20. The pad electrode PD may include a pad electrode layer. In an embodiment, for example, the pad electrode layer may include a first conductive layer C1, a second conductive layer C2, and a pad insulating layer IL.

Components included in the display device 10 shown in FIG. 6 may be substantially the same as the components included in the display device 10 shown in FIG. 5 except for the connection terminal BP. Therefore, descriptions of the components that are substantially the same as the components included in the display device 10 shown in FIG. 5 may be omitted below.

Referring to FIGS. 1 and 6, the connection terminal BP may include a conductive material, and may make contact with the connection conductive layer CC within the second organic layer opening H2.

According to an embodiment, the connection terminal BP may make contact with a first portion of the connection conductive layer CC covering the protruding part E. Simultaneously, the connection terminal BP may make contact with a second portion of the connection conductive layer CC covering the top surface of the pad electrode layer. In an embodiment, for example, the second portion of the connection conductive layer CC may be a portion of the connection conductive layer CC covering the top surface of the second conductive layer C2.

FIGS. 7 to 13 are views showing embodiments in a method of providing (or manufacturing) a display device 10. FIGS. 7 to 13 are cross-sectional views showing structures provided in an embodiment of a method of providing the display device 10 described with reference to FIG. 4.

Figure 7:
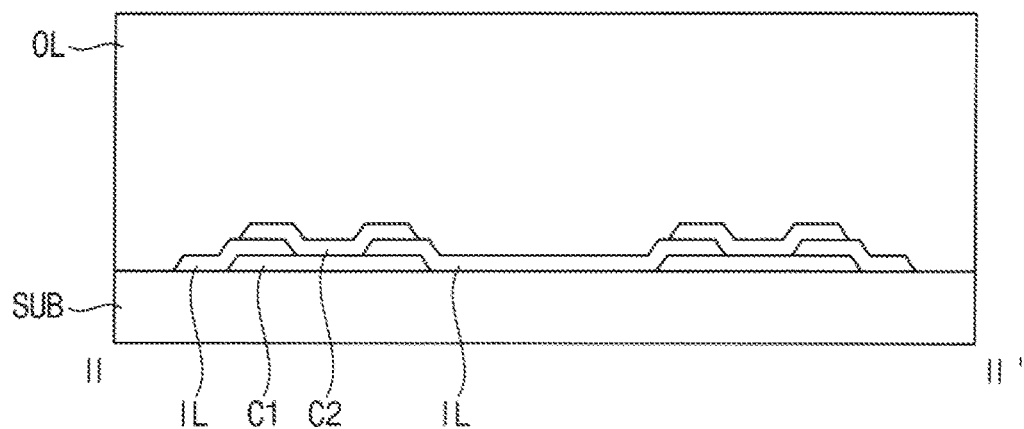
FIGS. 7 to 13 are cross-views showing a method of providing a display device.

Referring to FIG. 7, a pad electrode layer is formed (or provided) on a substrate SUB, and an organic layer OL may be formed on the pad electrode layer.

The substrate SUB may be formed by processing glass or plastic.

The pad electrode layer may include a first conductive layer C1, a second conductive layer C2, and a pad insulating layer IL. Each of the first and second conductive layers C1 and C2 may include a conductive material, and the pad insulating layer IL may include an inorganic insulating material.

The first conductive layer C1 may be formed on the substrate SUB. There is no limitation on a scheme of forming the first conductive layer C1, and various known schemes may be used. In an embodiment, for example, the first conductive layer C1 may be formed by applying a conductive material onto the substrate SUB, and patterning the conductive material applied onto the substrate SUB through dry etching. That is, the first conductive layer C1 may include a plurality of first conductive patterns provided from a (first) conductive material applied onto the substrate SUB.

The pad insulating layer IL may be formed on the first conductive layer C1. The pad insulating layer IL may define a through-hole TH that exposes at least a portion of a top surface of the first conductive layer C1 to outside the pad insulating layer IL.

The second conductive layer C2 may be formed on the pad insulating layer IL. The second conductive layer C2 may make contact with the first conductive layer C1 through the through-hole TH defined by the pad insulating layer IL. That is, the second conductive layer C2 may include a plurality of second conductive patterns provided from a (second) conductive material applied onto the substrate SUB.

An organic layer OL may cover the pad electrode layer. The organic layer OL may include an organic insulating material.

There is no limitation on a scheme of forming the pad insulating layer IL, the second conductive layer C2, and the organic layer OL, and various known schemes may be used.

Figure 8:
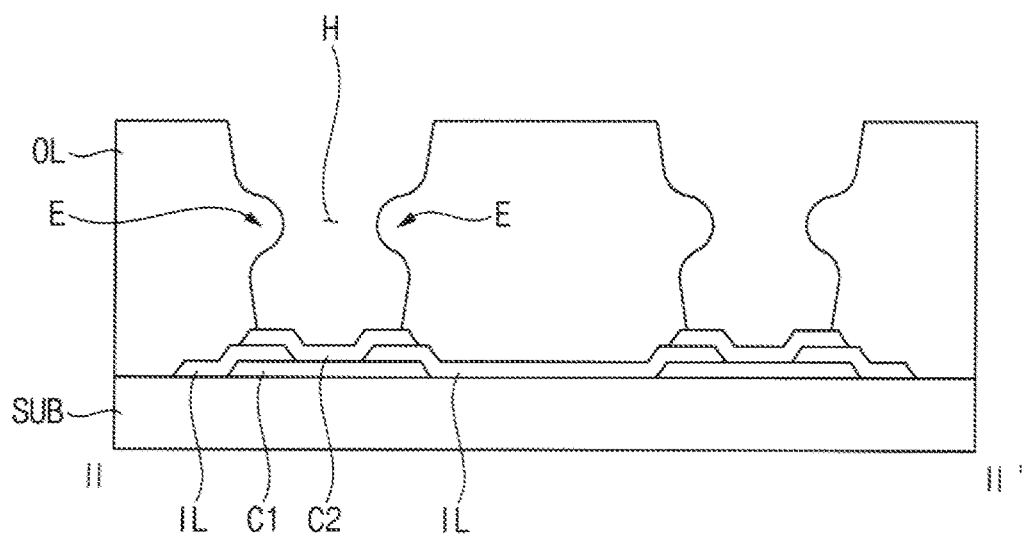

Referring to FIG. 8, an organic layer opening H and a protruding part E may be formed by etching the organic layer OL.

The organic layer opening H may expose at least a portion of a top surface of the pad electrode layer to outside the organic layer OL. In an embodiment, for example, the organic layer opening H may expose at least a portion of a top surface of the second conductive layer C2.

The protruding part E may be a portion of the organic layer OL which protrudes further than a remaining portion of a side surface of the organic layer OL at the organic layer opening H.

According to an embodiment, the organic layer opening H and the protruding part E may be formed by dry-etching the organic layer OL. In an embodiment, for example, the organic layer opening H and the protruding part E may be formed by performing first dry etching on the organic layer OL by using a first mask, and performing second dry etching on the organic layer OL by using a second mask.

Figure 9:
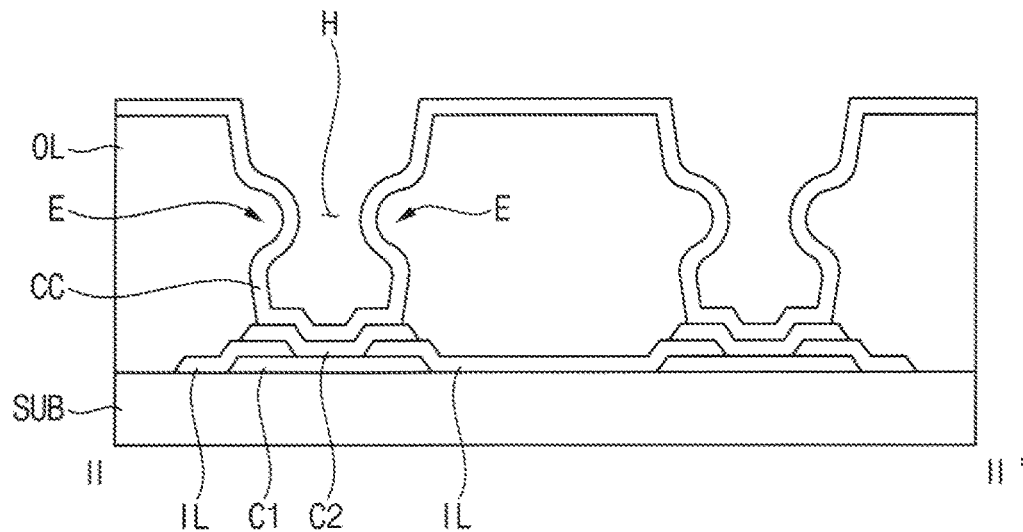
Figure 10:
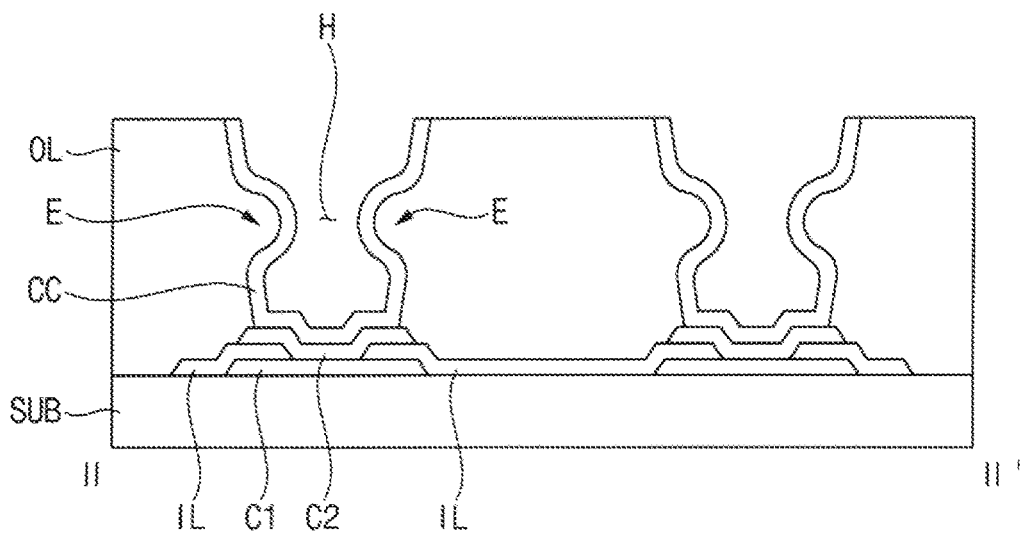

Referring to FIGS. 9 and 10, a connection conductive layer CC may cover the top surface of the pad electrode layer exposed by the organic layer opening H, the side surface of the organic layer opening H, and the protruding part E.

According to an embodiment, the connection conductive layer CC may be formed by a sputtering scheme. In detail, the connection conductive layer CC may be formed by applying a conductive material to a top surface of the organic layer OL, the top surface of the pad electrode layer exposed by the organic layer opening H, the side surface of the organic layer at the organic layer opening H, and the protruding part E by a sputtering scheme, and removing a portion of the conductive material applied to the top surface of the organic layer OL. In an embodiment, for example, the conductive material applied to the top surface of the organic layer OL may be removed by a dry etching scheme. That is, the connection conductive layer CC may include a plurality of third conductive patterns provided from a (third) conductive material applied onto the substrate SUB. The patterns of the connection conductive layer CC may be disconnected from each other at respective openings among the plurality of organic layer openings H.

Figure 11:
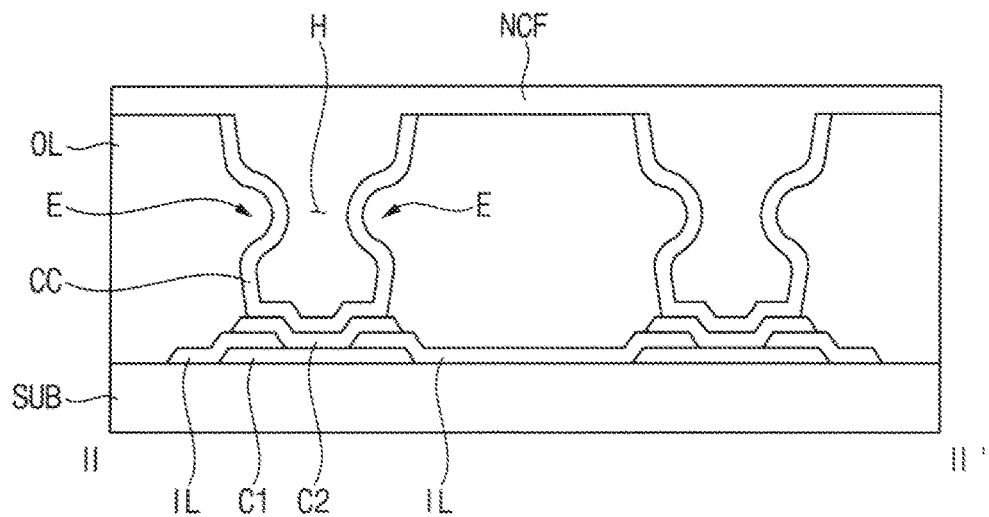

Referring to FIG. 11, an insulating material NCF may be applied onto the organic layer OL which is patterned to include the organic layer opening H. At this point, the insulating material NCF may extend from a top surface of the organic layer OL which is furthest from the substrate SUB and into the organic layer opening H to be applied into the organic layer opening H. In this case, the insulating material NCF applied into the organic layer opening H may be between the connection conductive layer CC and a connection terminal BP as will be described below.

Figure 12:
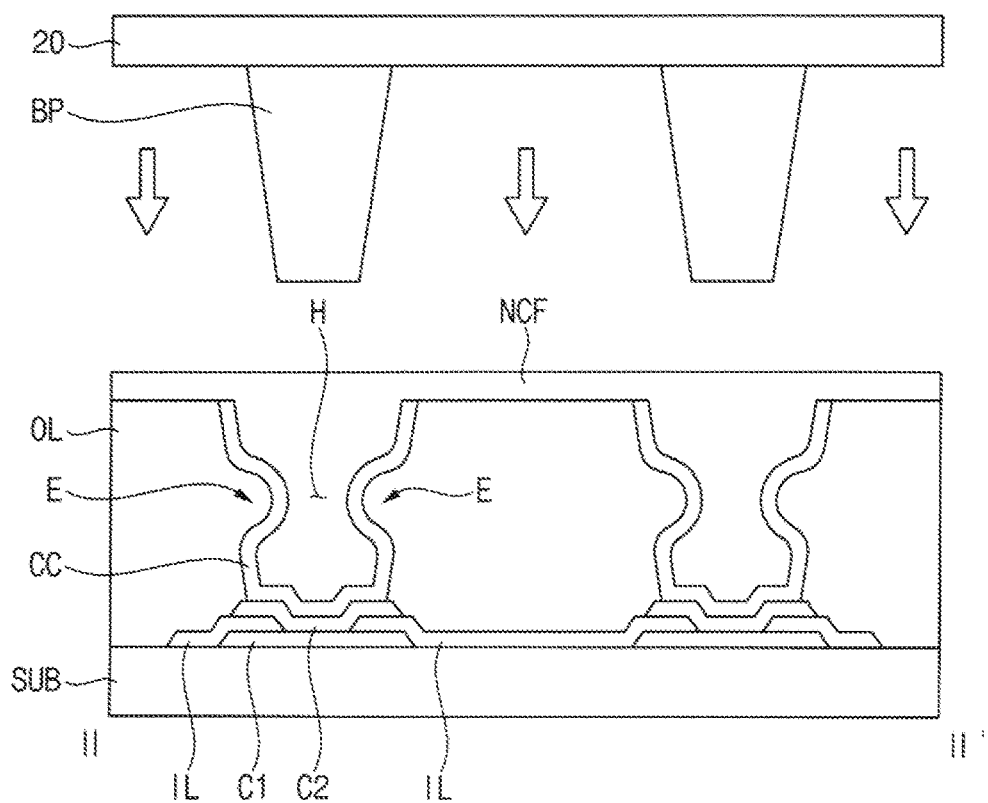
Figure 13:
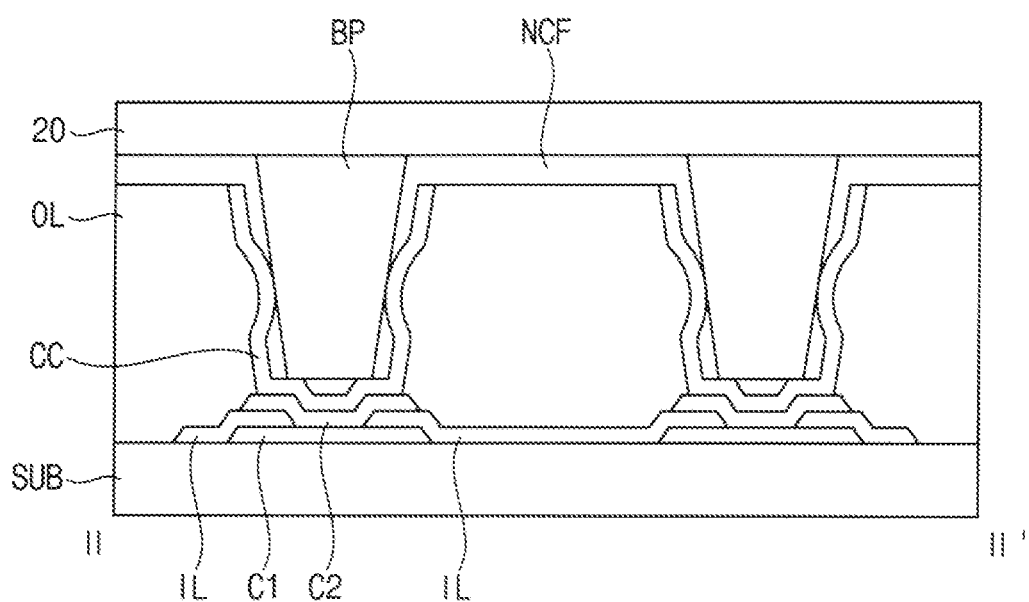

Referring to FIGS. 12 and 13, a driving circuit including a connection terminal BP and a driving chip 20 may be formed. A position of the connection terminal BP along the driving chip 20 may correspond to a location of the organic layer opening H. The driving chip 20 may be electrically connected to the connection terminal BP.

After the driving circuit is formed, the driving circuit may be arranged such that the connection terminal BP and the connection conductive layer CC may make contact with each other.

According to an embodiment, the connection terminal BP and the connection conductive layer CC may make contact with each other by softening the insulating material NCF by applying heat, aligning the driving circuit such that the connection terminal BP and the organic layer opening H overlap each other, and pressing the driving circuit toward the connection conductive layer CC inside of the organic layer opening H (see downward arrows in FIG. 12). In an embodiment, for example, the driving circuit may be pressed by a compression bar having a relatively high temperature.

According to an embodiment, the connection terminal BP may have a relatively large height along a thickness direction of the display panel 100. In this case, the connection terminal BP may make contact with a first portion of the connection conductive layer CC at the protruding part E. Simultaneously, the connection terminal BP may make contact with a second portion of the connection conductive layer CC covering the top surface of the pad electrode layer. In an embodiment, for example, the second portion of the connection conductive layer CC may be a portion of the connection conductive layer CC which extends along the exposed top surface of the second conductive layer C2.

According to an embodiment, the connection terminal BP may have a relatively small height (refer to FIG. 3, for example). In this case, the connection terminal BP may make contact with the first portion of the connection conductive layer CC at the protruding part E. Simultaneously, the connection terminal BP may be spaced apart from the second portion of the connection conductive layer CC which extends along the exposed top surface of the pad electrode layer.

According to an embodiment, a width of the organic layer opening H may be greater than a width of the connection terminal BP. In a direction along the substrate SUB, a maximum width of the organic layer opening H may be greater than a maximum width of the connection terminal BP. In an embodiment, for example, the width of the organic layer opening H may be greater than the width of the connection terminal BP by about 10 μm. Since a width of the organic layer opening H is reduced at the protruding part E by protrusions of the organic layer OL, even when the width of the organic layer opening H is greater than the width of the connection terminal BP, the connection terminal BP disposed in the organic layer opening H may be stably supported by the protruding part E. In addition, when the driving circuit is aligned such that the connection terminal BP and the organic layer opening H overlap each other, even when the driving circuit is misaligned within a predetermined range, the connection terminal BP may make contact with the connection conductive layer CC covering the protruding part E. In other words, even when the driving circuit is misaligned within a reference range, the pad electrode layer and the driving chip 20 may be electrically connected to each other at the organic layer opening H.

The connection terminal BP may have an interference fit with the connection conductive layer CC at the protruding part E, without being limited thereto. Referring to FIG. 13 relative to FIG. 12, insertion of the connection terminal BP in the organic layer opening H may increase a distance between portions of the connection conductive layer CC at the protruding part E, relative to an original distance between the portions of the connection conductive layer CC at the protruding part E.

Although embodiments of the display device 10 and the method of providing the display device 10 have been described above with reference to the drawings, the described embodiments are provided for illustrative purposes, and various changes and modifications can be made to the embodiments by those of ordinary skill in the art without departing from the technical idea of the present disclosure as set forth in the appended claims.

Embodiments of the display device 10 and the method of providing the display device 10 may be applied to a display device 10 of various electronic devices including, but not limited to, a computer, a mobile phone, a smartphone, a smart pad, and the like, and a method of providing (or manufacturing) the electronic device including the display device 10.

What is claimed is:

1. A display device comprising:
   a driving member which provides an electrical signal and includes a connection terminal which transmits the electrical signal;
   a pad electrode which receives the electrical signal from the driving member and is electrically connected to the connection terminal of the driving member;
   an organic layer on the pad electrode, the organic layer including:
      a side surface defining an opening of the organic layer which exposes the pad electrode to outside the organic layer, and
      within the opening, a protrusion protruding from the side surface; and
   a connection conductive layer which electrically connects the pad electrode to the connection terminal, within the opening of the organic layer,
   wherein the connection conductive layer covers each of the pad electrode which is exposed by the opening of the organic layer, the side surface of the organic layer, and the protrusion of the organic layer.

2. The display device of claim 1, wherein
   the connection terminal includes a distal end closest to the pad electrode which is exposed by the opening of the organic layer, and
   within the opening of the organic layer, the connection conductive layer includes:
      a first portion at the protrusion of the organic layer which contacts the connection terminal, and
      a second portion at the pad electrode which is exposed by the opening of the organic layer and is spaced apart from the distal end of the connection terminal.

3. The display device of claim 1, wherein
   the connection terminal includes a distal end closest to the pad electrode which is exposed by the opening of the organic layer, and
   within the opening of the organic layer, the connection conductive layer includes:
      a first portion at the protrusion of the organic layer which contacts the connection terminal, and
      a second portion at the pad electrode which is exposed by the opening of the organic layer and contacts the distal end of the connection terminal.

4. The display device of claim 1, further comprising an insulating adhesive member between the driving member and the organic layer.

5. The display device of claim 1, wherein the pad electrode includes in order toward the connection terminal:
   a first conductive layer; and
   a second conductive layer in contact with the first conductive layer.

6. The display device of claim 5, wherein
   the pad electrode further includes a pad insulating layer between the first conductive layer and the second conductive layer,
   the pad insulating layer defines a through-hole which exposes the first conductive layer to outside the pad insulating layer, and
   the second conductive layer contacts the first conductive layer at the through-hole.

7. The display device of claim 5, wherein
   the second conductive layer is exposed to outside the organic layer by the opening of the organic layer, and
   the connection conductive layer contacts the second conductive layer at the opening of the organic layer.

8. A display device comprising:
a driving member which provides an electrical signal and includes a connection terminal which transmits the electrical signal;
a pad electrode which receives the electrical signal from the driving member and is electrically connected to the connection terminal of the driving member;
a first organic layer on the pad electrode, the first organic layer defining a first opening of the first organic layer which exposes the pad electrode to outside the first organic layer;
a second organic layer on the first organic layer, the second organic layer including:
a side surface defining a second opening of the second organic layer which exposes a portion of the first organic layer which is adjacent to the first opening to outside the second organic layer, and
within the second opening, a protrusion protruding from the side surface; and
a connection conductive layer which electrically connects the pad electrode to the connection terminal, within the second opening of the second organic layer,
wherein the connection conductive layer covers each of the pad electrode which is exposed by the first opening of the first organic layer, the side surface of the second organic layer, and the protrusion of the second organic layer.

9. The display device of claim 8, wherein
the connection terminal includes a distal end closest to the pad electrode which is exposed by the first opening of the first organic layer, and
within the second opening of the second organic layer, the connection conductive layer includes:
a first portion at the protrusion of the second organic layer which contacts the connection terminal, and
a second portion at the pad electrode which is exposed by the first opening of the first organic layer and is spaced apart from the distal end of the connection terminal.

10. The display device of claim 8, wherein
the connection terminal includes a distal end closest to the pad electrode which is exposed by the first opening of the first organic layer, and
within the second opening of the second organic layer, the connection conductive layer includes:
a first portion at the protrusion of the second organic layer which contacts the connection terminal, and
a second portion at the pad electrode which is exposed by the first opening of the first organic layer and contacts the distal end of the connection terminal.

11. The display device of claim 8, wherein the pad electrode includes in order toward the connection terminal:
a first conductive layer; and
a second conductive layer in contact with the first conductive layer.

12. The display device of claim 11, wherein
the pad electrode further includes a pad insulating layer between the first conductive layer and the second conductive layer,
the pad insulating layer defines a through-hole which exposes the first conductive layer to outside the pad insulating layer, and
the second conductive layer contacts the first conductive layer at the through-hole.

13. The display device of claim 11, wherein
the second conductive layer is exposed to outside the first organic layer by the first opening of the first organic layer, and
the connection conductive layer contacts the second conductive layer at the first opening of the first organic layer.

14. A method of providing a display device, the method comprising:
providing a driving member which provides an electrical signal and includes a connection terminal which transmits the electrical signal;
providing a pad electrode which receives the electrical signal from the driving member and is electrically connected to the connection terminal of the driving member;
providing an organic layer on the pad electrode, the organic layer including:
a side surface defining an opening of the organic layer which exposes the pad electrode to outside the organic layer, and
within the opening, a protrusion protruding from the side surface;
providing a connection conductive layer within the opening of the organic layer, the connection conductive layer covering each of the pad electrode which is exposed by the opening of the organic layer, the side surface of the organic layer, and the protrusion of the organic layer; and
providing an electrical connection between the pad electrode and the connection terminal, through the connection conductive layer.

15. The method of claim 14, wherein the providing of the connection conductive layer includes:
providing a conductive material to a top surface of the organic layer, a top surface of the pad electrode which is exposed by the opening of the organic layer, the side surface of the organic layer, and the protrusion of the organic layer; and
providing the connection conductive layer which covers each of the pad electrode which is exposed by the opening of the organic layer, the side surface of the organic layer, and the protrusion of the organic layer by removing the conductive material which is provided to the top surface of the organic layer.

16. The method of claim 14, further comprising providing an insulating material onto the organic layer and the connection conductive layer after the providing of the connection conductive layer.

17. The method of claim 16, wherein the providing of the insulating material includes providing the insulating material between the connection conductive layer and the connection terminal which has the electrical connection with the pad electrode.

18. The method of claim 16, wherein the providing of the electrical connection between the pad electrode and the connection terminal includes:
providing softening of the insulating material;
providing alignment of the connection terminal with the opening of the organic layer; and
providing contact between the connection terminal and the connection conductive layer.

19. The method of claim 14, wherein
the connection terminal includes a distal end closest to the pad electrode which is exposed by the opening of the organic layer, and within the opening of the organic layer, the connection conductive layer includes:
  a first portion at the protrusion of the organic layer which contacts the connection terminal, and
  a second portion at the pad electrode which is exposed by the opening and is spaced apart from the distal end of the connection terminal.

20. The method of claim 14, wherein
the connection terminal includes a distal end closest to the pad electrode which is exposed by the opening of the organic layer, and
within the opening of the organic layer, the connection conductive layer includes:
  a first portion at the protrusion of the organic layer which contacts the connection terminal, and
  a second portion at the pad electrode which is exposed by the opening and contacts the distal end of the connection terminal.

\* \* \* \* \*